(12) United States Patent
Sumida et al.

(10) Patent No.: US 8,173,508 B2
(45) Date of Patent: May 8, 2012

(54) SEMICONDUCTOR DEVICE HAVING VERTICAL TYPE MOSFET AND MANUFACTURING METHOD THEREOF

(75) Inventors: Wataru Sumida, Kanagawa (JP); Kenya Kobayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 42 days.

(21) Appl. No.: 12/591,883

(22) Filed: Dec. 3, 2009

(65) Prior Publication Data

US 2010/0155833 A1  Jun. 24, 2010

(30) Foreign Application Priority Data

Dec. 18, 2008 (JP) ................... 2008-322197

(51) Int. Cl.
*H01L 21/336* (2006.01)
(52) U.S. Cl. ............... 438/270; 257/330; 257/E29.257; 438/259
(58) Field of Classification Search .................. 257/330, 257/E29.201, E29.257, E29.26; 438/259, 438/270–271, 589
See application file for complete search history.

(56) References Cited

U.S. PATENT DOCUMENTS 6,551,881 B1 * 4/2003 Letavic .................. 438/267
2003/0060014 A1 * 3/2003 Neidhart et al. ............ 438/270

FOREIGN PATENT DOCUMENTS

JP       2004-31385     *  1/2004

* cited by examiner

*Primary Examiner* — David Vu
(74) *Attorney, Agent, or Firm* — McGinn IP Law Group, PLLC

(57) ABSTRACT

A method (and resultant structure) includes forming a semiconductor layer having plural stripe-like trenches, forming a gate electrode buried partially in each of the plural trenches, and introducing an impurity into the semiconductor layer by ion implantation after forming the gate electrode. The gate electrode has a buried portion formed in each of the trenches and a protruding portion situating above the buried portion and having a width larger than that of the buried portion. The introducing the impurity includes introducing an impurity into the semiconductor layer below the protruding portion by oblique ion implantation.

16 Claims, 18 Drawing Sheets

SEMICONDUCTOR DEVICE HAVING VERTICAL TYPE MOSFET AND MANUFACTURING METHOD THEREOF

INCORPORATION BY REFERENCE

This application is based upon and claims the benefit of priority from Japanese Patent Application No. 2008-322197 which was filed on Dec. 18, 2008, the disclosure of which is incorporated herein in its entirety by reference.

BACKGROUND OF THE INVENTION

1. Field of the Invention

The present invention concerns a semiconductor device and a manufacturing method thereof. The present invention particularly relates to a semiconductor device having a trench gate structure and a manufacturing method thereof.

2. Description of Related Art

A semiconductor device having a "trench gate structure" in which a gate electrode is buried in a trench has been known. For example, Patent Document (Japanese Patent Application Laid-Open No. 2004-31385) discloses a vertical MOSFET (Vertical-type Metal Oxide Silicon Field-Effect Transistor) having a trench gate structure.

More specifically, Patent Document describes a technique for decreasing the gate resistance of a vertical MOSFET. The vertical MOSFET has a trench gate structure formed in a stripe shape to a semiconductor substrate in an actual operation region. Further, a lattice-like gate lead electrode in connection with the trench gate structure is provided on the actual operation region. Since the cross sectional area that can be utilized as a gate electrode is increased, the gate resistance is decreased.

FIG. 1 shows a cross sectional structure of a vertical MOSFET described in Patent Document. An $N^-$ type epitaxial layer 102 that functions as a drain region is formed over an $N^+$ type semiconductor substrate 101. Further, a P type channel layer 120 is formed over the $N^-$ type epitaxial layer 102. Further, an $N^+$ type source region 125 is formed to the surface of the P type channel layer 120. Plural trenches 110 are formed in a stripe shape to a semiconductor layer containing the epitaxial layer 102, the channel layer 120, and the source region 125. Each trench 110 is formed so as to reach the epitaxial layer 102 passing through the source region 125 and the channel layer 120.

A gate electrode 150 is formed by way of a gate oxide film 130 to the surface of each of the trenches 110. The gate electrode 150 has a buried portion 150a formed in the trench 110. That is, the vertical MOSFET shown in FIG. 1 has a trench gate structure. Further, the gate electrode 150 has a protruding portion 150b that protrudes from the trench 110 and a bridge portion (not illustrated) that connects protruding portions 150b adjacent with each other. Protruding portions 150 and bridge portions constitute a lattice-like gate lead electrode. It is to be noted that, as shown in FIG. 1, the protruding portion 150b extends in an eave shape from the opening of the trench 110 and has a width larger than that of the trench 110 (buried portion 150a). The wide protruding portion 150b also constitutes to the decrease of the gate resistance.

The surface of the protruding portion 150b of the gate electrode 150 is covered with an interlayer insulating film 160. Further, a contact hole 165 is formed so as to penetrate the interlayer insulating film 160 between the adjacent gate electrodes 150 and the source region 125. A $P^+$ type body contact region 128 is formed to the channel layer 120 below the contact hole 165. Then, a source electrode 170 is formed so as to be in connection with the body contact region 128 and the source region 125.

FIG. 2A to FIG. 2E are cross sectional views showing manufacturing steps of the structure shown in FIG. 1. At first, as shown in FIG. 2A, an $N^-$ type epitaxial layer 102 that functions as a drain region is formed above the $N^+$ type semiconductor substrate 101. Successively, a P type channel layer 120 is formed in the epitaxial layer 102 through an ion implantation and thermal diffusion treatment. Further, stripe-like trenches 110 are formed through anisotropic dry etching by using a mask having a predetermined pattern. Each trench 110 is formed so as to reach the epitaxial layer 102 penetrating the channel layer 120. Then, a thermal oxidation treatment is carried out to form a gate oxide film 130 over the entire surface.

Then, as shown in FIG. 2B, a non-doped polysilicon layer 140 is deposited over the entire surface. Further, for increasing the conductivity, phosphorus at a high concentration is introduced into the polysilicon layer 140. Then, as shown in FIG. 2C, an NSG (Non-doped Silicate Glass) film 145 having a predetermined pattern is formed as a mask which is used for patterning an upper gate electrode 150 (protruding portion 150b, bridge portion). Then, the polysilicon layer 140 is etched by using the NSG film 145 as a mask. As a result, as shown in FIG. 2D, the gate electrode 150 (protruding portion 150b, bridge portion) having a predetermined pattern is formed. In this case, it is to be noted that the protruding portion 150b is formed to a width larger than that of the trench 110 (buried portion 150a) for decreasing the gate resistance.

Then, as shown in FIG. 2E, an $N^+$ type impurity is ion implanted for forming an $N^+$ type source type region 125. Then, after ion implantation, a thermal diffusion treatment at a high temperature is carried out. As a result, an $N^+$ type source region 125 is formed to the surface of the channel layer 120 between adjacent trenches 110. Then, an interlayer insulating film 160, a contact hole 165, a body contact region 128, a source electrode 170, etc. are formed.

SUMMARY

The present inventor has noted the following point. In the relevant technique described above, the protruding portion 150b of the gate electrode 150 is formed so as to be wider than the trench 110 (buried portion 150a) for decreasing the gate resistance. As a result, as shown in FIG. 2D, the protruding portion 150b covers the channel layer 120 at the periphery of the trench 110. That is, a portion of the channel layer 120 between adjacent trenches 110 situates below the protruding portion 150b. When ion implantation is conducted under such a situation, the protruding portion 150b is obstructive.

For example, as shown in FIG. 2E, after forming the gate electrode 150, ion implantation is conducted for forming the $N^+$ type source region 125. FIG. 3 shows details for the treatment of forming the source region 125. At first, an $N^+$ type impurity is introduced to the surface of the channel layer 120 by ion implantation. In this case, since the wide protruding portion 150b protruding from the trench 110 is formed, the $N^+$ type impurity is not introduced to the channel layer 120 below the protruding portion 150b. Therefore, after the ion implantation, a thermal diffusion treatment is carried out at a high temperature (for example, about 1000° C.). This enables the source region 125 to extend also below the protruding portion 150b. That is, the source region 125 can be formed entirely between adjacent trenches 110 by the combination of the ion implantation and the thermal diffusion treatment. In other words, since the wide protruding portion 150b is formed, it is necessary to conduct the thermal diffusion treatment at a high temperature after ion implantation.

However, when the thermal diffusion treatment is conducted at a high temperature, the depth of the source region 125 after ion implantation fluctuates greatly. More specifically, as shown in FIG. 3, the source region 125 undesirably extends also in the direction of the depth. Increase of the depth of the source region 125 may possibly lower the withstand voltage or increase the on resistance. The reason is to be described with reference to FIG. 4 and FIG. 5.

FIG. 4 shows a case in which the source region 125 has a certain depth and FIG. 5 shows a case in which the depth of the source region 125 is larger than that in the case of FIG. 4. FIG. 4 and FIG. 5 also show the distribution of an impurity concentration. Further, in FIG. 4 and FIG. 5, the channel length (thickness of the channel layer 120) is indicated by "t". For ensuring an identical channel length t, the channel layer 120 has to be previously formed deeper in the case of FIG. 5 than in the case of FIG. 4 (refer to the step shown in FIG. 2A). For forming the P type channel layer 120 further deeply, it is necessary to set the thermal diffusion temperature after implantation of the P type impurity to a higher temperature (for example, about 1,000° C.). However, when the thermal diffusion temperature is set excessively high, the N type impurity diffuses from the N$^+$ type semiconductor substrate 101 to the N$^-$ type epitaxial layer 102 (drain region). The phenomenon is generally referred to as "upward diffusion". The "upward diffusion" results in lowering of the withstand voltage of the vertical MOSFET. It may be considered to previously form the N$^-$ type epitaxial layer 102 thickly. However, as the thickness of the epitaxial layer 102 increases, the on resistance is increased by so much.

The present invention provides, in one exemplary aspect, a method of manufacturing a semiconductor device. The manufacturing method includes forming a semiconductor layer having plural stripe trenches, forming a gate electrode buried partially in each of the plural trenches, and introducing an impurity to the semiconductor layer by ion implantation after forming the gate electrode. The gate electrode has a buried portion formed in each of the trenches and a protruding portion situating on the buried portion and wider than the buried portion. The introducing the impurity includes introducing an impurity to a semiconductor layer below the protruding portion by oblique ion implantation.

The present invention provides, in another exemplary aspect, a semiconductor device. The semiconductor device has a semiconductor layer formed with plural stripe trenches and a gate electrode buried partially in each of the plural trenches. The gate electrode has a buried portion formed in each of the trenches and a protruding portion situating on the buried portion and having a width larger than that of the buried portion. The semiconductor device further has an impurity layer formed to the semiconductor layer between buried portions adjacent with each other and a concave portion formed to the surface of the semiconductor layer between the protruding portions adjacent with each other. The position of the concave portion on the lateral side is aligned with the position of the protruding portion on the lateral side.

According to the aspects, in a semiconductor device having a trench gate structure, a gate electrode having a wide protruding portion protruding from the trench can be formed. As a result, the gate resistance is decreased. Further, an impurity can be introduced accurately at desired depth and concentration in the semiconductor layer below the protruding portion by oblique ion implantation. It is not necessary to conduct a thermal diffusion treatment in an excessively high temperature state for diffusing the impurity below the protruding portion. Accordingly, deterioration of device characteristics can be prevented. That is, according to the present invention, deterioration of the device characteristics can be prevented while decreasing the resistance of the trench gate structure.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

1. First Exemplary Embodiment 1-1. Structure

The semiconductor device according to the exemplary embodiment has a trench gate structure. Such a semiconductor device includes, for example, a vertical field effect transistor. An N channel type vertical MOSFET is to be described as an example. It should be noted that the situation is identical also in a case of a P-channel type vertical MOSFET.

Figure 6:
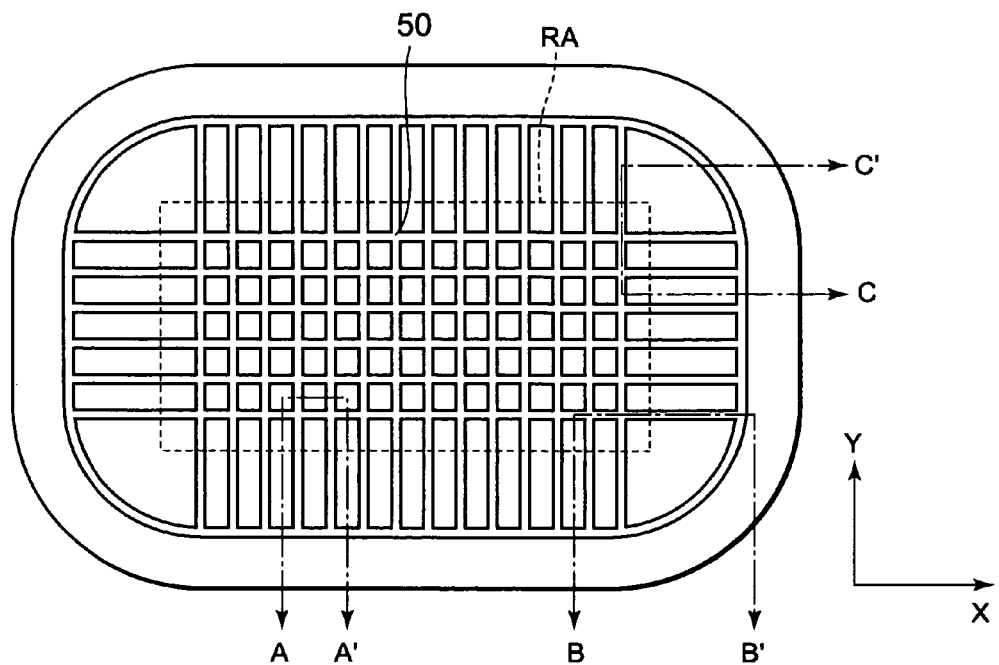
FIG. 6 is a plan view showing a semiconductor device according to a first exemplary embodiment of the present invention.
Figure 7:
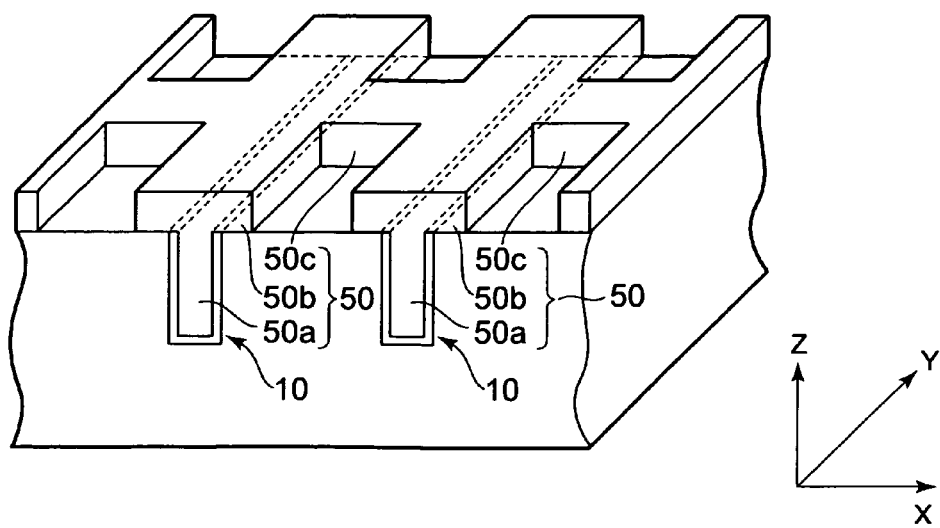
FIG. 7 is a perspective view showing a semiconductor device according to the first exemplary embodiment of the present invention.

FIG. 6 is a plan view showing a vertical MOSFET according to the first exemplary embodiment. In FIG. 6, rectangular region shown by a broken line represents an actual operation region RA of a vertical MOSFET. FIG. 7 is a perspective view showing a structure in the actual operation region RA in an enlarged scale.

In the vertical MOSFET according to the first exemplary embodiment, plural trenches 10 are formed to a semiconductor substrate (semiconductor layer). As shown in FIG. 7, the plural trenches 10 are formed substantially in parallel to each other along direction Y. That is, the plural trenches 10 are formed in a "stripe shape". In the specification, a direction of a plane perpendicular to the extending direction of the trench 10 (direction Y) is defined as direction X, and a vertical direction perpendicular to the direction X and the direction Y is defined as direction Z.

The vertical MOSFET has a trench gate structure. More specifically, as shown in FIG. 7, the vertical MOSFET has a gate electrode 50 buried partially in each of the trenches 10. The gate electrode 50 has at least a buried portion 50a and a protruding portion 50b. The buried portion 50a is a portion formed so as to be buried in each of the trenches 10 and extends in the direction Y along each of the trenches 10. On the other hand, the protruding portion 50b is a portion protruding from each of the trenches 10 and situates above the buried portion 50a. Further, the protruding portion 50b extends in an eave shape from the opening of the trench 10 and the width thereof (width in the direction X) is larger than the width of the buried portion 50a (trench 10). Such a wide protrusion 150b contributes to the decrease of the gate resistance.

The gate electrode 50 may further have a bridge portion 50c. As shown in FIG. 7, the bridge portion 50c is a portion that connects two protruding portions 50b adjacent with each other. Since the protruding portions 50b adjacent with each other are connected by the bridge portion 50c, the gate electrode is further decreased preferably.

Figure 8:
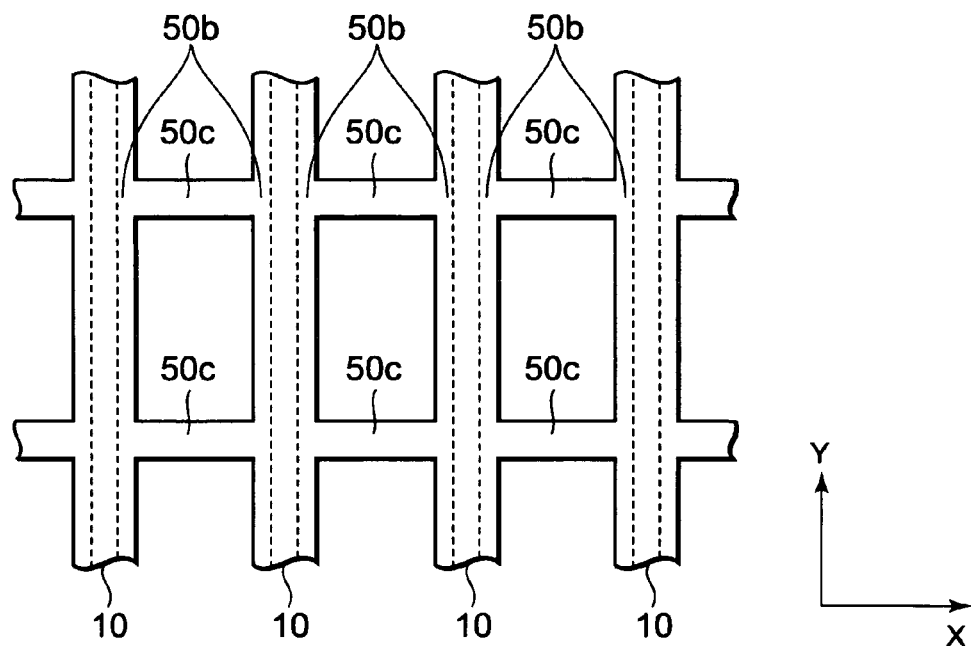
FIG. 8 is a plan view showing an example of a pattern for a gate electrode in the exemplary embodiment.
Figure 9:
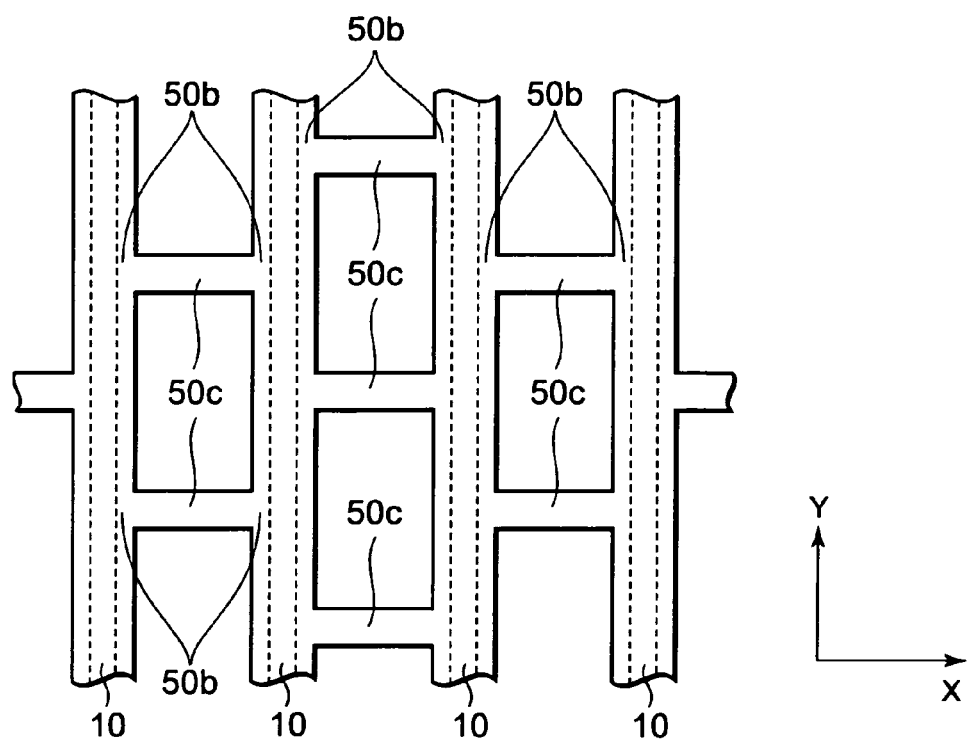
FIG. 9 is a plan view showing another example of a pattern for a gate electrode in the exemplary embodiment.

In the example shown in FIG. 6, the gate electrode 50 has a lattice-like pattern in the actual operation region RA. Further, the gate electrode 50 has a ring-like pattern connected with the lattice-like pattern at the periphery of the actual operation region RA. However, the planar pattern of the gate electrode 50 is not restricted thereto. As shown in FIG. 8 and FIG. 9, the planar pattern of the gate electrode 50 is optional.

Figure 10A:
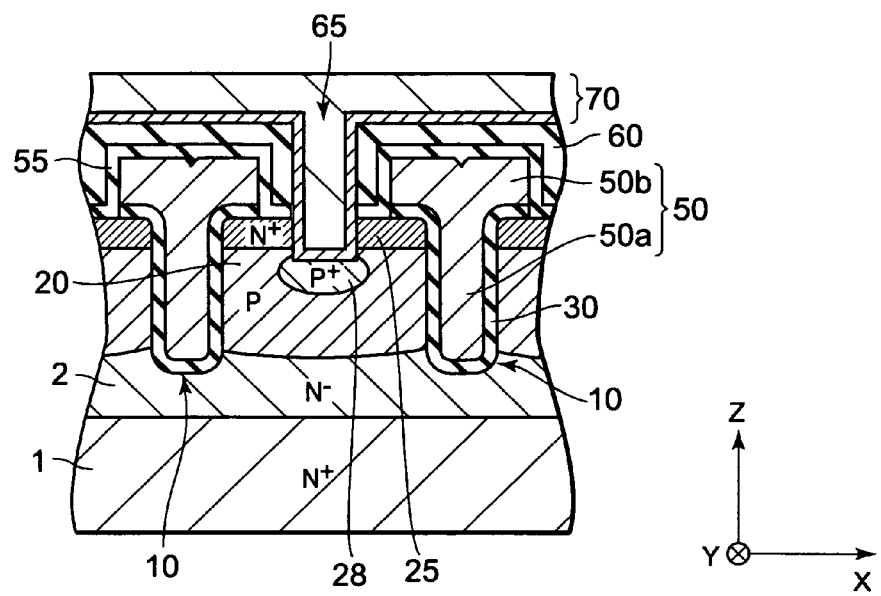
FIG. 10A is a cross sectional view showing a structure along line A-A' in FIG. 6.
Figure 10B:
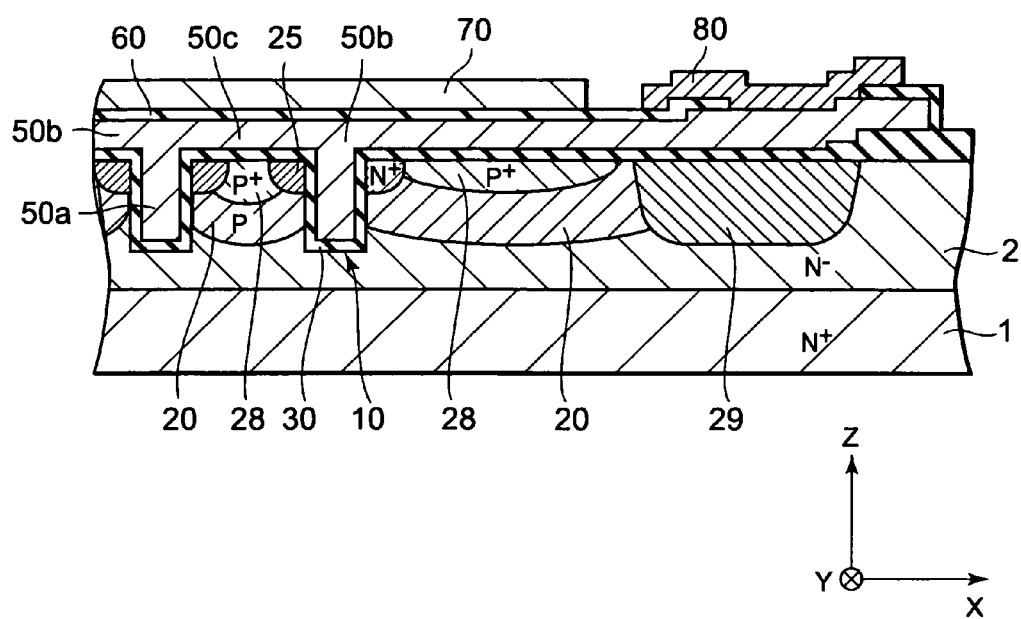
FIG. 10B is a cross sectional view showing a structure along line B-B' in FIG. 6.
Figure 10C:
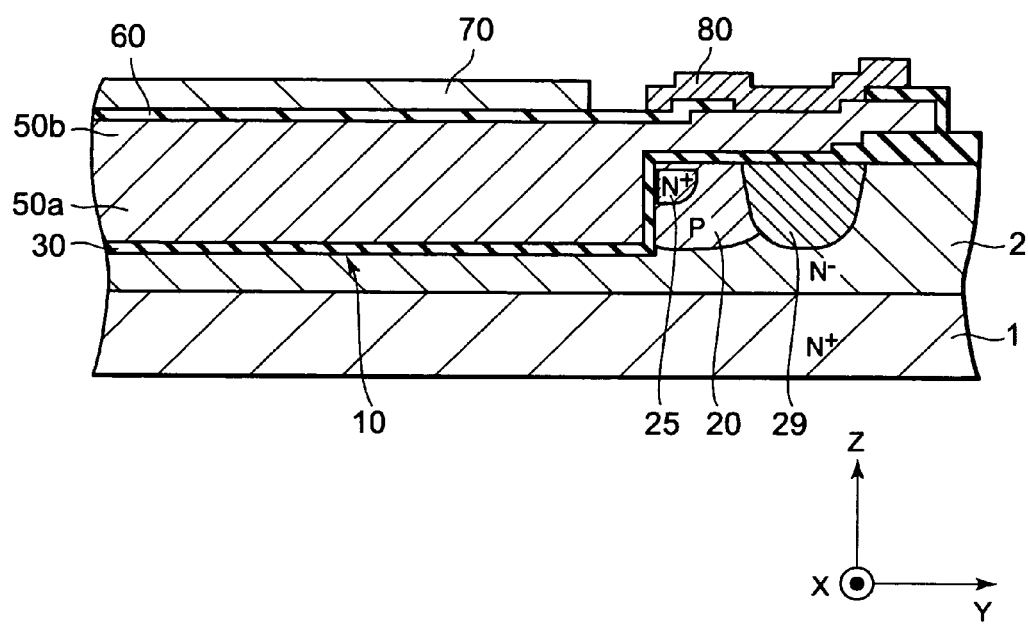
FIG. 10C is a cross sectional view showing a structure along line C-C' in FIG. 6.

The structure of the vertical MOSFET is to be described more specifically with reference to FIG. 10A to FIG. 10C. FIG. 10A to FIG. 10C show the cross sectional structures along line A-A', line B-B' and line C-C' in FIG. 6, respectively.

As shown in FIG. 10A, an N⁻ type epitaxial layer 2 is formed above an N⁺ type semiconductor substrate 1. The semiconductor substrate 1 is, for example, a silicon substrate. The epitaxial layer 2 functions as a drain region. Further, a P type channel layer 20 is formed above the N⁻ type epitaxial layer 2. Further, an N⁺ type source region 25 is formed to the surface of the P type channel layer 20.

The semiconductor layer containing the epitaxial layer 2 (drain region), the channel layer 20, and the source region 25 has plural stripe-like trenches 10 described previously. That is, plural trenches 10 extending substantially in parallel along the direction Y are formed in the semiconductor layer. Each trench 10 is formed so as to reach the epitaxial layer 2 while penetrating the source region 25 and the channel layer 20. The channel layer 20 and the source region 25 are formed between trenches 10 adjacent with each other. That is, the channel layer 20 and the source region 25 are formed so as to be adjacent with the trench 10.

The gate electrode 50 described previously is formed by way of a gate insulating film 30 above the surface of each of the trenches 10. The gate insulating film 30 is, for example, an oxide film. The gate electrode 50 is formed, for example, of polysilicon. The gate electrode 50 is buried partially in each of the trenches 10. That is, as shown in FIG. 10A, the gate electrode 50 includes a buried portion 50a formed in each of the trenches 10 and a protruding portion 50b protruding from each of the trenches 10. As described above, the width (width in the direction X) of the protruding portion 50b is larger than the width of the buried portion 50a (trench 10). The wide protruding portion 50b contributes to the decrease of the gate resistance.

The source region 25 (impurity layer) is formed to the semiconductor layer between the buried portions 50a adjacent with each other. That is, the source region 25 and the buried portion 50a are adjacent with each other by way of the gate insulating film 30. It is to be noted that the wide protruding portion 50b covers the source region 25 at the periphery of the trench 10 as shown in FIG. 10A. That is, a portion of the source 25 situates below the protruding portion 50b of the gate electrode 50. A method of forming such a source region 25 below the protruding portion 50b is to be described specifically later.

The surface of the gate electrode 50 is covered with a protective insulating film 55. The protective insulating film 55 is, for example, an oxide film. Further, an interlayer insulating film 60 is formed on the protective insulating film 55. Further, a contact hole 65 is formed so as to penetrate the interlayer insulating film 60, the protective insulating film 55, and the source region 25 between the gate electrodes 50 adjacent with each other. A P⁺ type body contact region 28 is formed in the channel layer 20 below the contact hole 65. Then, a source electrode 70 is formed so as to be in connection with the body contact region 28 and the source region 25. The source electrode 70 includes, for example, a barrier metal film (for example, TiN film) formed on the inner wall of the contact hole 65 and the surface of the interlayer insulating film 60, and a metal film (for example, Al film) formed on the barrier metal film.

As shown in FIG. 10B, a bridge portion 50c of the gate electrode 50 is formed by way of the gate insulating film 30 above the semiconductor layer. The bridge portion 50c connects two protruding portions 50b adjacent with each other. The bridge portion 50c contributes to the decrease of the gate resistance. The source region 25 and the body contact region 28 can be formed also below the bridge portion 50c.

As shown in FIG. 10B and FIG. 10C, a gate connection electrode 80 in connection with the end of the gate electrode 50 may be formed at the outside of the actual operation region RA. Further, a guard ring 29 may also be formed in the semiconductor layer at the outside of the actual operation region RA.

1-2. Manufacturing Method

Then, a method of manufacturing a vertical MOSFET according to the exemplary embodiment is to be described with reference to FIG. 11A to FIG. 11L. FIG. 11A to FIG. 11L show cross sectional structures along line A-A' in the manufacturing steps (refer to FIG. 10A).

Figure 11A:
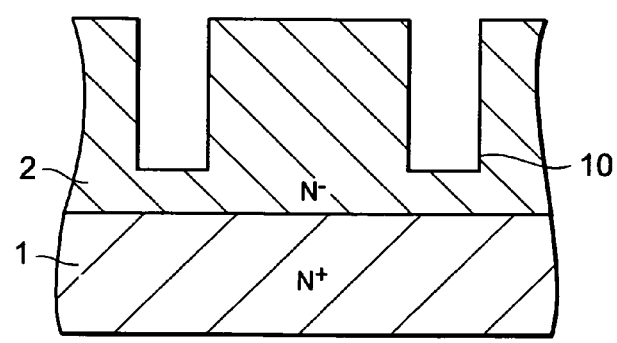
FIGS. 11A to 11L illustrate cross sectional views each showing a manufacturing step of a semiconductor device according to a first exemplary embodiment.

At first, as shown in FIG. 11A, an N⁻ type epitaxial layer 2 is formed above an N⁺ type semiconductor substrate 1 by epitaxial growing. The semiconductor substrate 1 is, for example, a silicon substrate. The epitaxial layer 2 functions as a drain region. Successively, a mask (not illustrated) for forming a trench 10 is formed on the epitaxial layer 2. Anisotripic etching (silicon etching) is conducted by using the mask to form plural trenches 10 in the epitaxial layer 2. The plural trenches 10 are formed in a stripe shape along the direction Y.

Figure 11B:
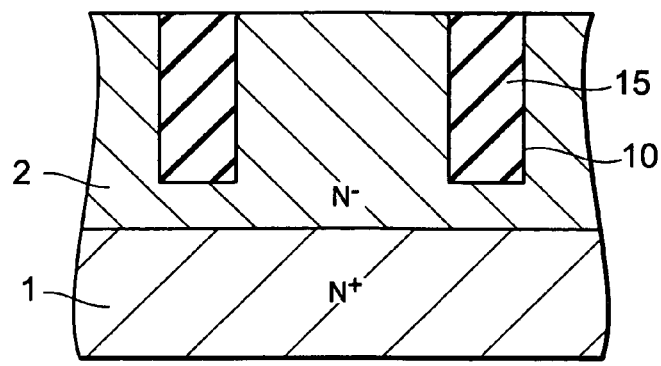
Figure 11C:
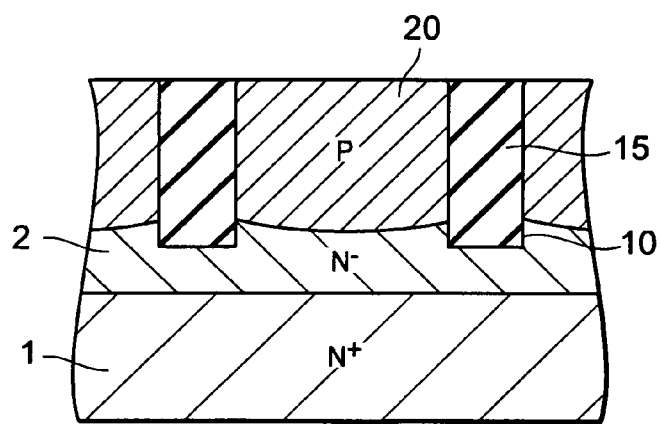

Then, a high temperature thermal oxidation treatment is conducted to make the edge (corner portion) round at the opening and the bottom of the trench 10. For example, after forming a sacrificial oxide film to the silicon surface in an oxidation atmosphere under the condition at about 1,100° C., the sacrificial oxide film is removed by etching. As a result, as shown in FIG. 11B, all of the corner portions are made round at the opening and the bottom of the trench 10. Assuming that when the gate insulating film 30 to be described later is formed without rounding the corner portion of the trench 10, the thickness of the gate insulating film 30 is decreased near the corner portion to lower the gate insulation withstanding voltage. The gate insulation voltage is improved by rounding the corner portion of the corner 10.

Successively, after forming an NSG (Non-doped Silicate Glass) film 15 over the entire surface by a CVD method, it is etched back. As a result, as shown in FIG. 11B, the NSG film 15 burying the inside of the plural trenches 10 (buried insulating film) is formed.

Then, an ion implantation and diffusion treatment of a P type impurity (for example, boron) is conducted. As a result, as shown FIG. 11C, a P type channel layer 20 formed in the epitaxial layer 2. The P type channel layer 20 is formed in the epitaxial layer 2 between the trenches 10 adjacent with each other. As described above, a semiconductor layer having plural stripe-like trenches 10 is formed.

Figure 11D:
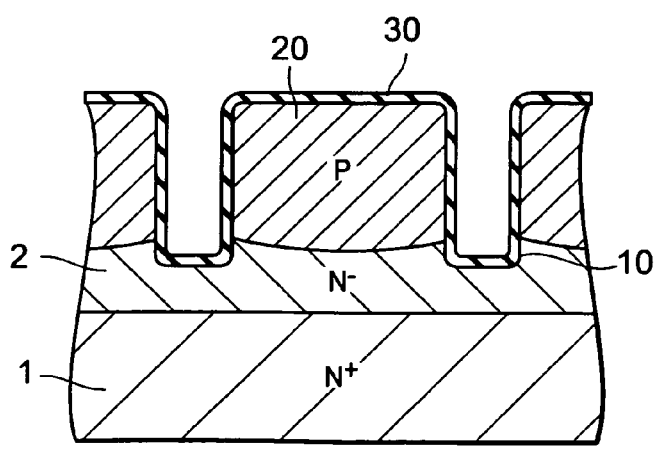

Then, as shown in FIG. 11D, the NSG film 15 in the trench 10 is removed. For example, plasma etching is conducted so as to leave the NSG film 15 on the side wall of the trench 10. Then, the NSG film 15 remaining on the side wall is removed by wet etching. As a result of the process described above, damages to the side wall of the trench 10 by plasma etching are prevented.

Successively, as shown in FIG. 11D, a gate insulating film 30 is formed over the entire surface. For example, a thermal oxidation treatment is conducted and the oxide film is formed as the gate insulating film 30. As described above, since damages caused to the side wall of the trench 10 by the plasma etching is prevented, the gate insulating film 30 of good quality is formed. As a result, the reliability of the device is improved. Further, since the corner portion of the trench 10 is rounded, reduction of the thickness of the gate insulating film 30 near the corner portion is prevented. As a result, a gate insulative voltage is improved.

Figure 11E:
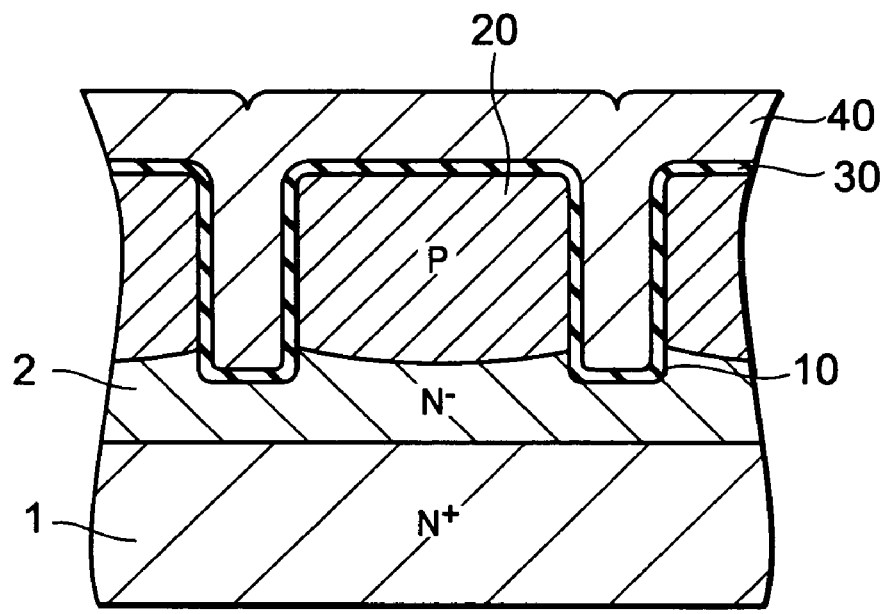

Then, as shown in FIG. 11E, a gate material film 40 as a material for the gate electrode is formed over the entire surface. For example, a non-doped polysilicon film is deposited over the entire surface by a CVD method. Further, for increasing the conductivity, phosphorus at a high concentration is introduced into the polysilicon film. As described above, the gate material film 40 is formed on the gate insulating film 30. The gate material film 40 is formed so as to fill each of the trenches 10 and, further, protrude out of each of the trenches 10.

Figure 11F:
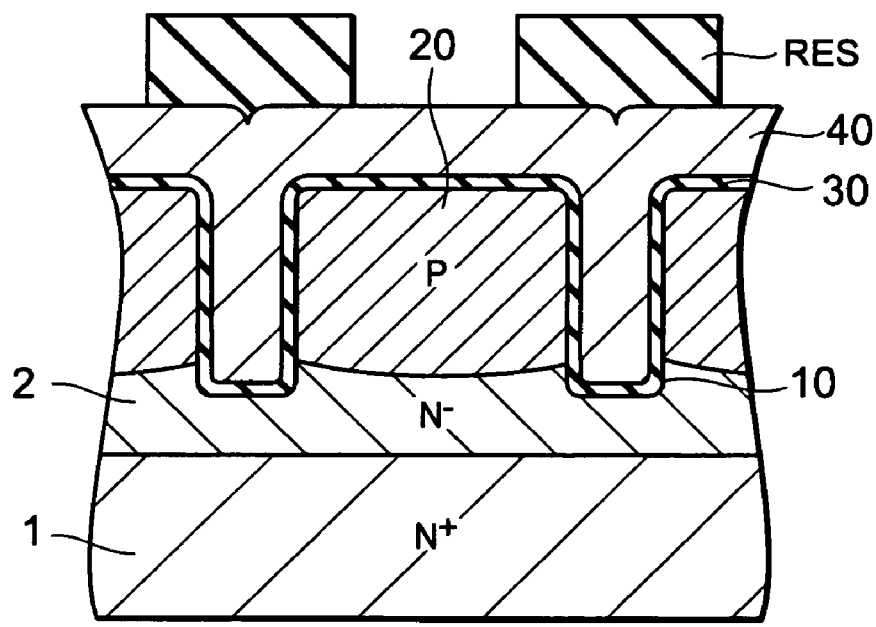

Then, as shown in FIG. 11F, a resist mask RES having a desired gate pattern is formed above the gate material film 40. The desired gate pattern is a planar pattern for the gate electrode 50 intended to be formed (refer to FIG. 6, FIG. 8, and FIG. 9), which can be designed optionally in accordance with demanded device characteristics.

Figure 11G:
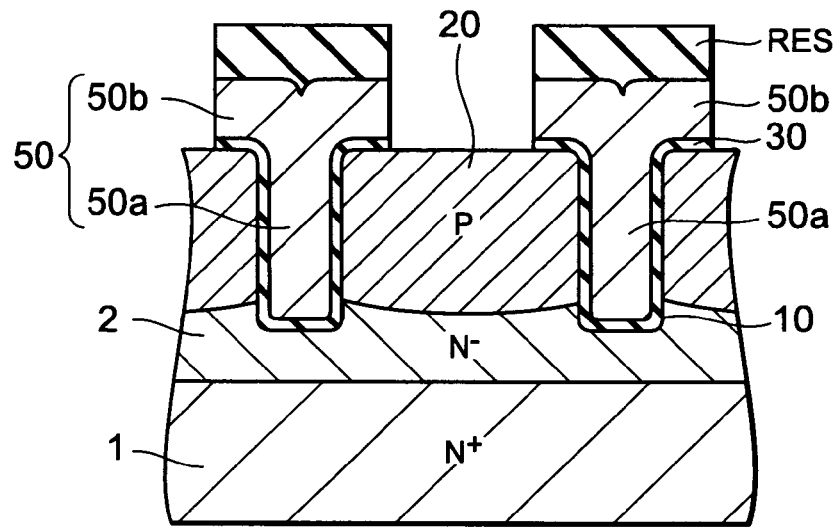

Then, as shown in FIG. 11G, the gate material film 40 is etched (patterned) by using the resist mask RES. As a result, a gate electrode 50 having a desired gate pattern (refer to FIG. 6, FIG. 8, and FIG. 9) is formed. The formed gate electrode 50 is buried partially into each of the trenches 10 and has the buried portion 50a and the protruding portion 50b described above. The protruding portion 50b extends in an eave shape from the opening of the trench 10 and the width thereof (width in the direction X) is larger than the width of the buried portion 50a (trench 10). Further, a bridge portion 50c connecting the protruding portions 50b adjacent with each other may also be formed (refer to FIG. 8, FIG. 9, FIG. 10B). The buried portion 50a, the protruding portion 50b, and the bridge portion 50c are formed collectively by the gate process and formed individually from an identical material.

Then, wet etching is further conducted by using the rest mask RES to remove the exposed gate insulating film 30. As a result, the P type channel 20 is exposed at a portion other than the region formed with the resist mask RES as shown in FIG. 11G. On the other hand, the P type channel layer 20 is not exposed in the region formed with the resist mask RES. Particularly, it should be noted that the protruding portion 50b covers the channel layer 20 at the periphery of the trench 10, and a portion of the channel layer 20 situates below the protruding portion 50b.

Figure 11H:
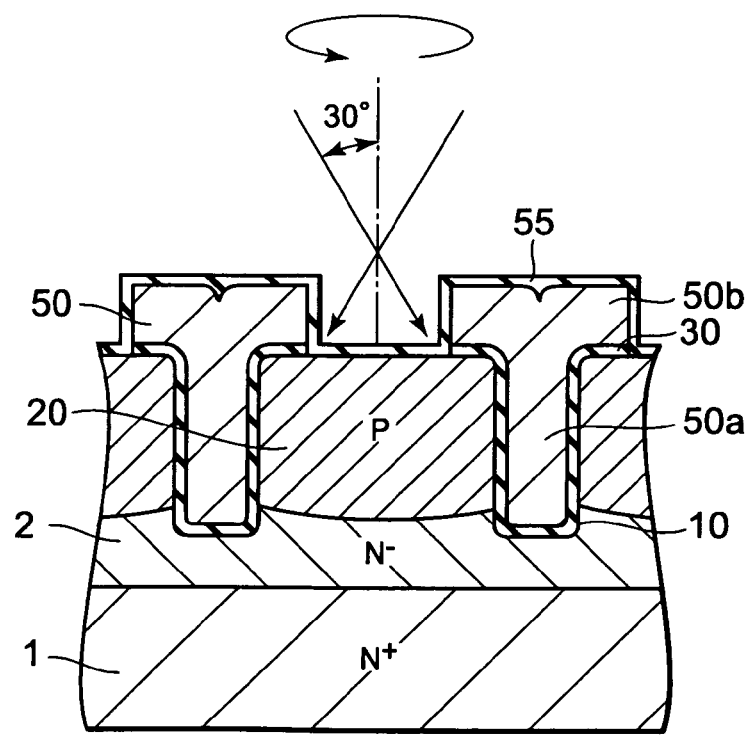

Then, after removing the resist mask RES, a protective insulating film 55 is formed over the entire surface as shown in FIG. 11H, for moderating damages upon ion implantation. The protective insulating film 55 is, for example, an oxide film. Successively, for adjusting a threshold voltage (Vt) of the vertical MOSFET, ion implantation is conducted. Specifically, a P type impurity at a predetermined concentration is introduced again into the P type channel layer 20 (semiconductor layer).

As shown in FIG. 11H, the P type impurity is introduced into the P type channel layer 20 by "oblique ion implantation". The oblique ion implantation is conducted while rotating the substrate. For example, boron is implanted at an incident angle: θ=30°. Since boron (mass number 11) is relatively light in weight, it can be implanted sufficiently also to a deep portion in the channel layer 20. The P type impurity can be introduced reliably also to the channel layer 20 below the protruding portion 50b or the bridge portion 50c of the gate electrode 50 by such oblique ion implantation. That is, the P type impurity can be introduced accurately at intended depth and impurity concentration also below the protruding portion 50b or the bridge portion 50c. After the oblique ion implantation, a thermal diffusion treatment is conducted at a relatively low temperature (about 850° C.).

A threshold voltage is adjusted after completion of the gate electrode 50. That is, the threshold voltage is adjusted after completion of a high temperature treatment such as a thermal treatment for forming the gate insulating film 30 and introduction of phosphorus at a high concentration into the polysilicon film (gate material film 40), etc. High temperature treatment is not conducted after adjusting the threshold voltage. Accordingly, the impurity concentration in the channel layer 20 does not fluctuate by the application of high temperature after adjusting the threshold voltage. That is, fluctuation of the threshold voltage is prevented preferably.

Figure 11I:
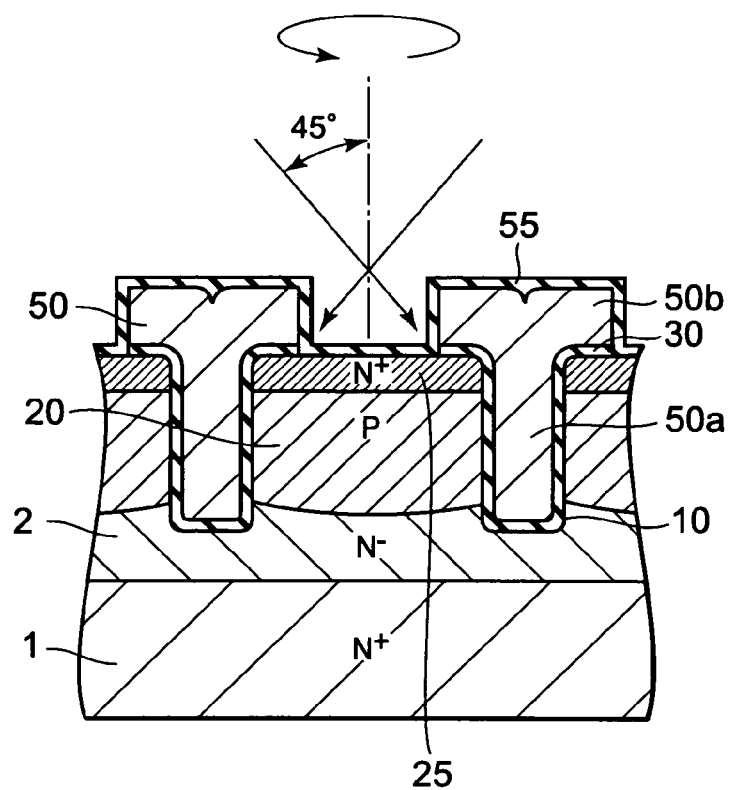

Then, as shown in FIG. 11I, ion implantation is conducted for forming an N$^+$ type source region 25 (impurity layer). The source region 25 is formed to the surface of the channel layer 20 between the buried portions 50a (trenches 10) adjacent with each other. However, as described above, the wide protruding portion 50b covers the channel layer 20 at the periphery of the trench 10, and a portion of the channel layer situates below the protruding portion 50b. Then, "oblique ion implantation" is conducted.

Specifically, the N type impurity is introduced into the P type channel layer 20 by "oblique ion implantation". The oblique ion implantation is conducted while rotating the substrate. For example, as shown in FIG. 11I, arsenic is implanted at an incident angle: $\theta=45°$. By the oblique ion implantation described above, the N type impurity can be introduced reliably also in the channel layer 20 below the protruding portion 50b and the bridge portion 50c of the gate electrode 50. That is, the N type impurity can be introduced accurately at intended depth and impurity concentration also below the protruding portion 50b and the bridge portion 50c. After the oblique ion implantation, a thermal diffusion treatment is conducted at a relatively low temperature (about 850° C.).

The upper limit for the size from the side wall of the trench 10 to the side wall of the protruding portion 50b is about 0.1 μm. For decreasing the gate resistance, it is desirable to form the protruding portion 50b as wide as possible. However, for forming the source region 25 with no problem also below the protruding portion 50b by the method according to the exemplary embodiment, it is not preferred to excessively extend the protruding portion 50b. With such a view point, the upper limit for the size is set to about 0.1 μm. On the other hand, there is no problem for re-introduction of boron since a desired introduction depth can be ensured by the control for the implantation angle and an acceleration energy at a usual level.

Figure 11J:
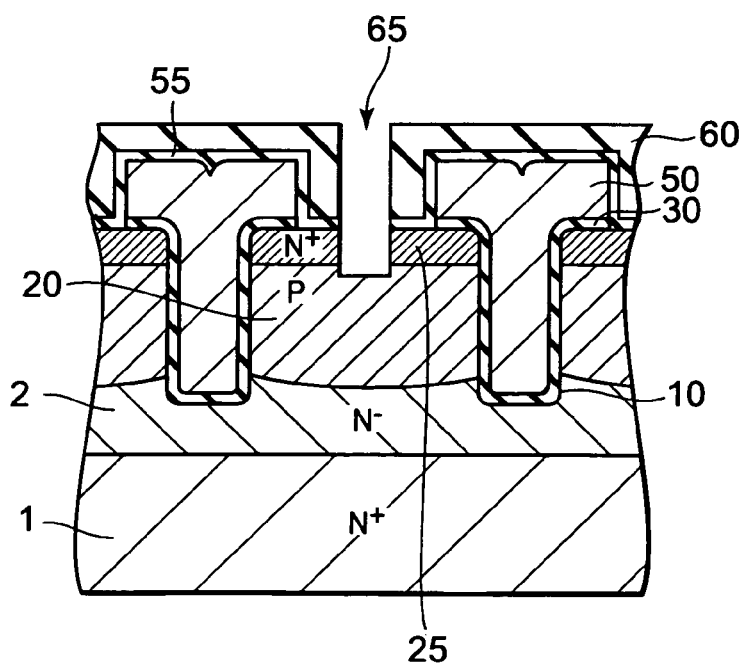

Then, as shown in FIG. 11J, after depositing an interlayer insulating film 60 over the entire surface by a CVD method, the upper surface of the interlayer insulating film 60 is planarized. Successively, a contact hole 65 is formed by etching using a mask having a predetermined pattern (not illustrated). The contact hole 65 is formed so as to reach the channel layer 20 while penetrating the interlayer insulating film 60, the protective insulating film 55, and the source region 25 between the gate electrodes 50 adjacent with each other.

Figure 11K:
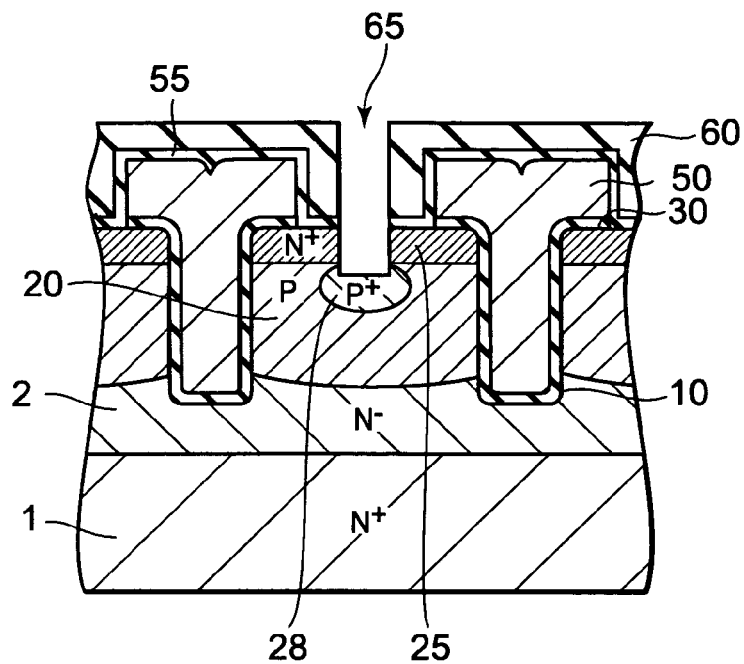

Then, as shown in FIG. 11K, a $P^+$ type body contact region 28 is formed in the channel layer 20 below the contact hole 65. The body contact region 28 is formed by ion implantation of a P type impurity and a thermal diffusion treatment at a relatively low temperature (about 850° C.).

Figure 11L:
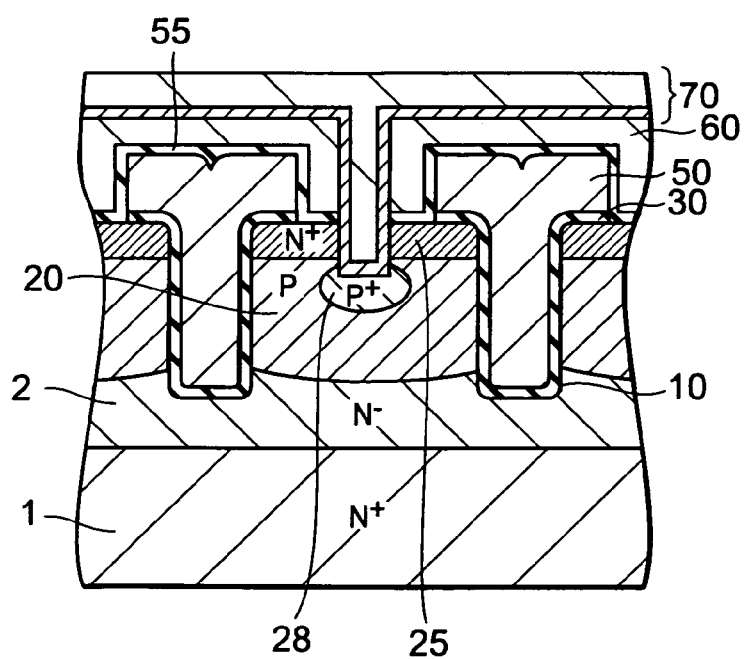

Then, as shown in FIG. 11L, a source electrode 70 is formed so as to be in connection with the body contact region 28 and the source region 25. The source electrode 70 is composed of, for example, a barrier metal film (for example, TiN film) formed to the inner wall of the contact hole 65 and on the surface of the interlayer insulating film 60, and a metal film (for example, Al film) formed on the barrier metal film. Further, a gate connection electrode 80 (refer to FIG. 10B, FIG. 10C) is also formed simultaneously in this step.

1-3. Effect

Figure 1:
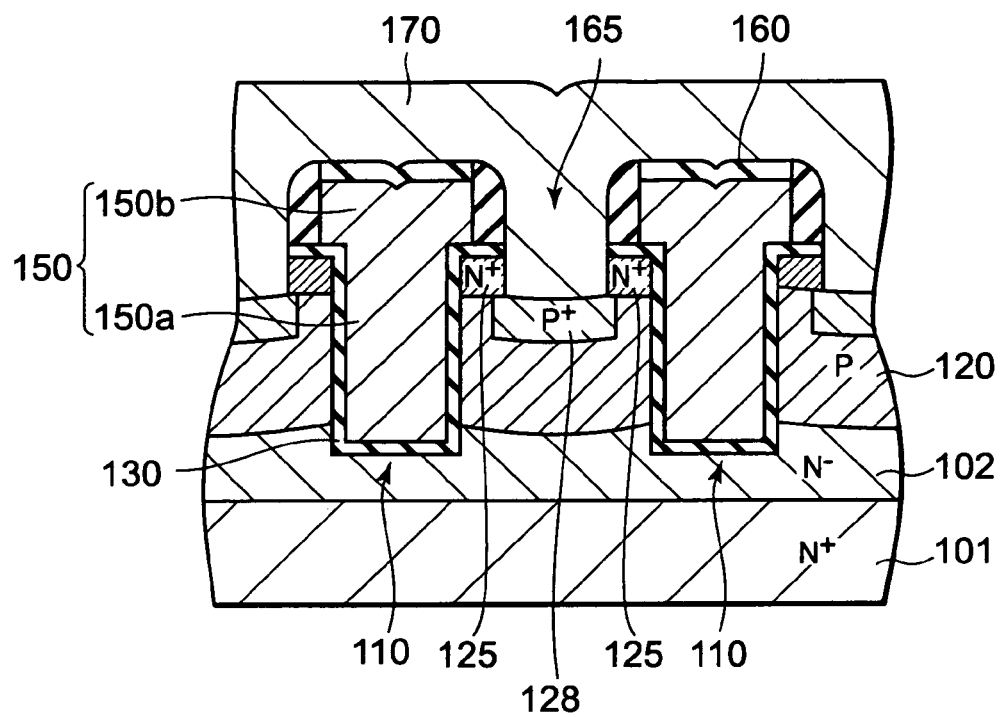
FIG. 1 is a cross sectional view showing a structure of a vertical MOSFET of a related art.
Figure 2A:
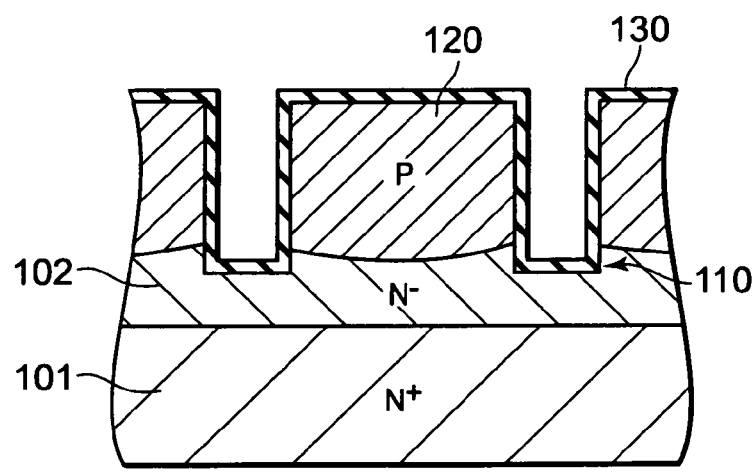
FIGS. 2A to 2E illustrate cross sectional views each showing a manufacturing step of a vertical MOSFET of the related art.
Figure 2B:
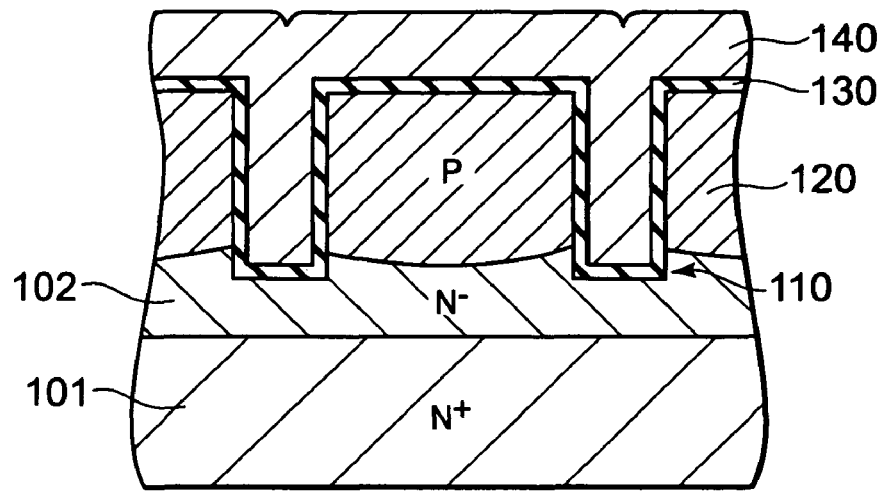
Figure 2C:
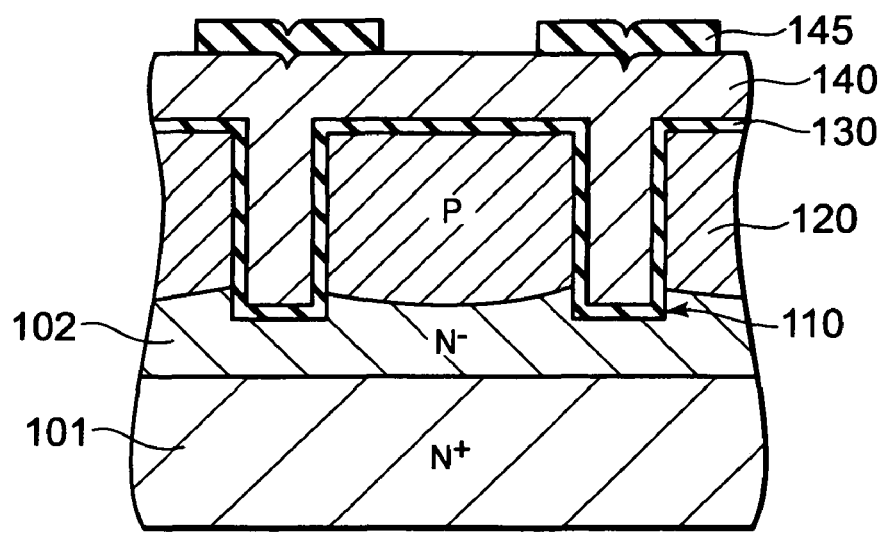
Figure 2D:
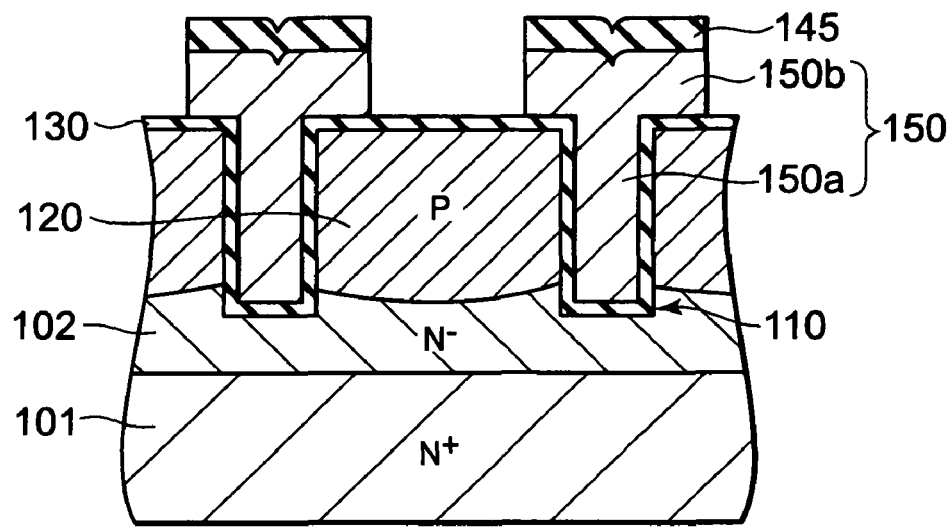
Figure 2E:
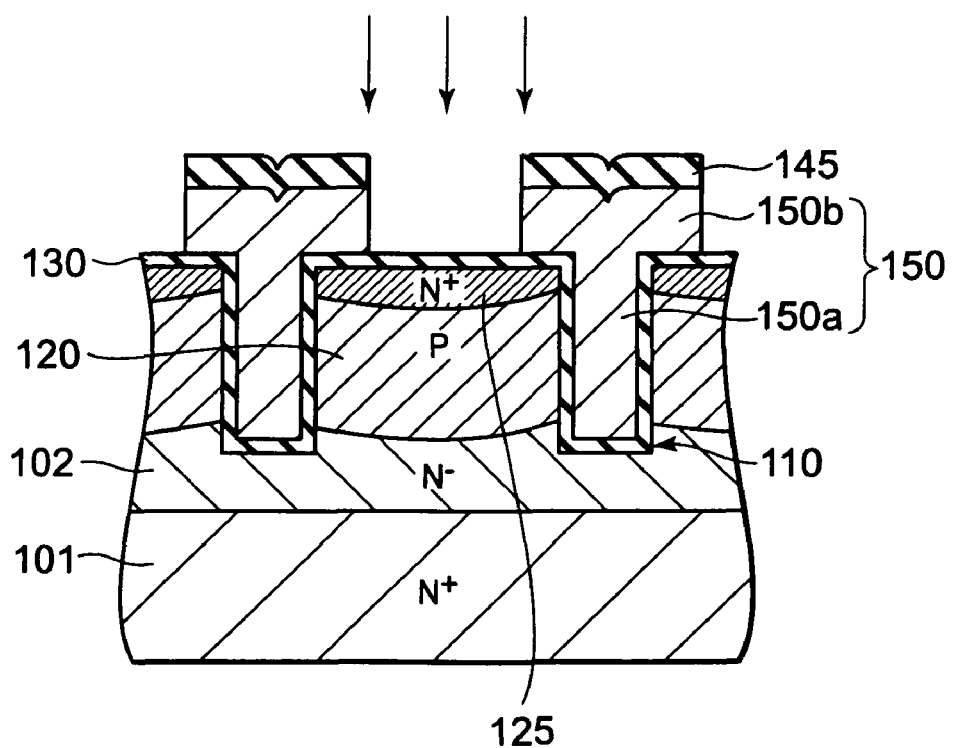
Figure 3:
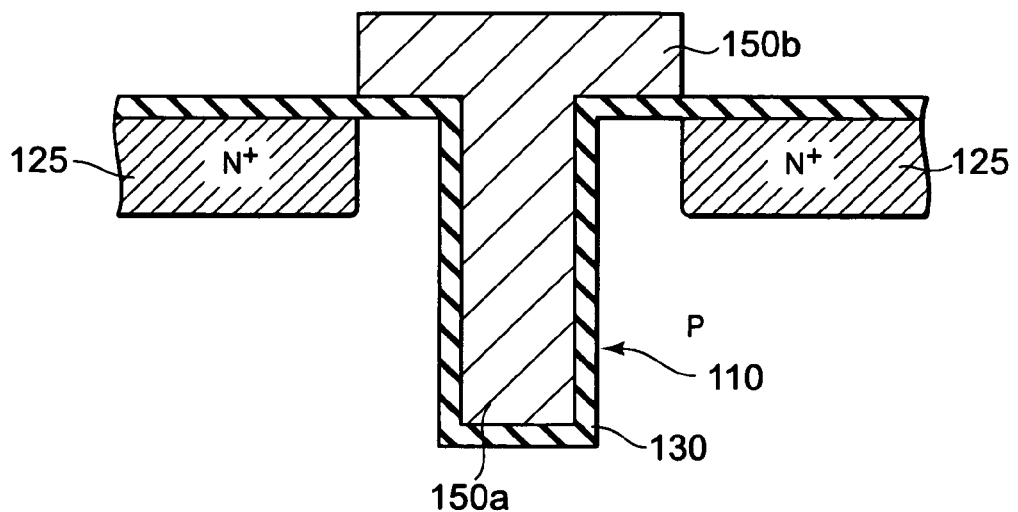
FIGS. 3 to 5 illustrate conceptional views for explaining a problem of the related art.
Figure 3:
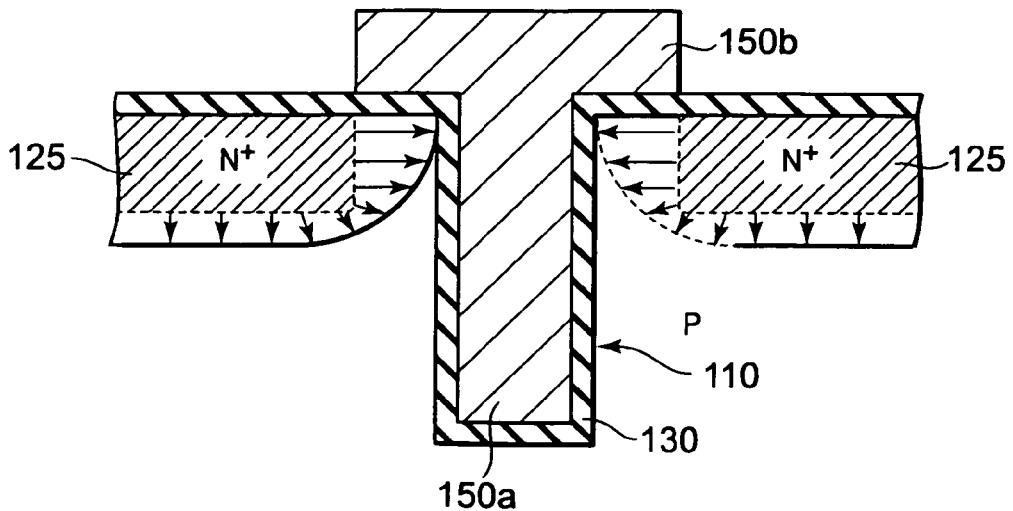
Figure 4:
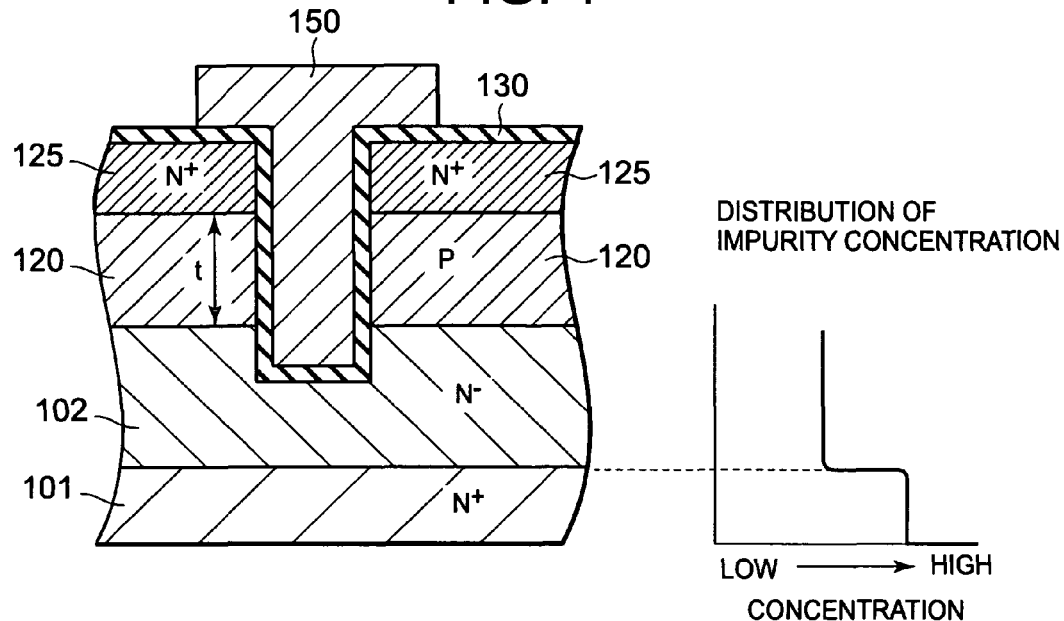
Figure 5:
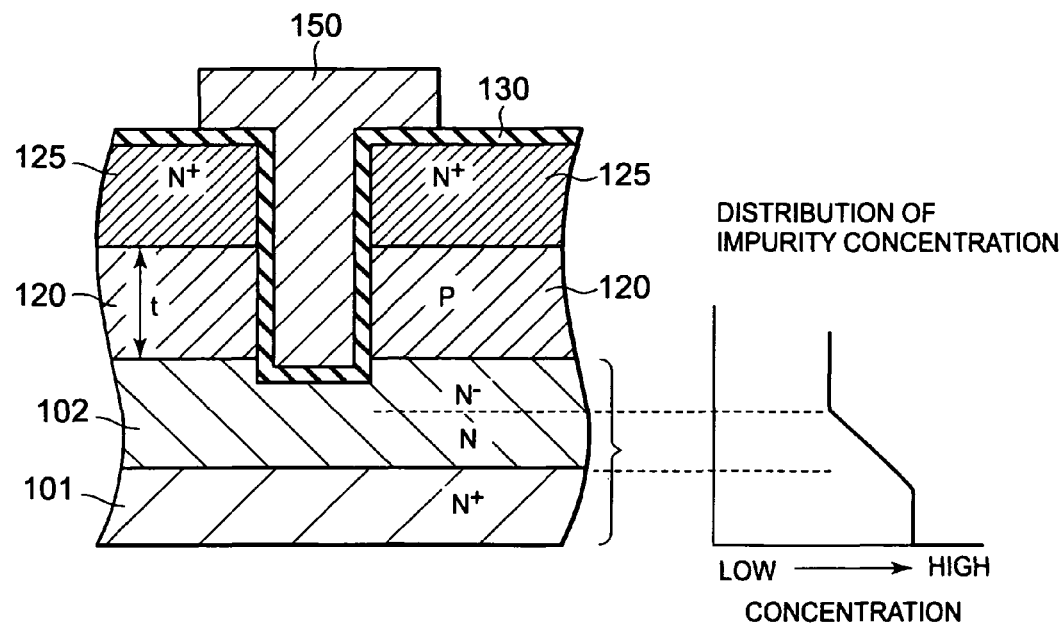

According to the first exemplary embodiment, the gate electrode 50 having the wide protruding portion 50b protruding from the trench 10 can be formed. As a result, the gate resistance is decreased. Further, by the oblique ion implantation described above, the impurity can be introduced accurately at desired depth and concentration also into the channel layer 20 below the protruding portion 50b of the gate electrode 50. Accordingly, the thermal diffusion treatment after the impurity implantation can be conducted at a relatively low temperature (about 850° C.). Since it is not necessary to perform the thermal diffusion treatment under an excessively high temperature state, diffusion of the impurity layer in the direction of the depth as shown in FIG. 3 described above can be suppressed. As a result, deterioration of the device characteristics can be prevented. That is, deterioration of the device characteristics can be prevented while decreasing the resistance of the trench gate structure.

Further, as shown in FIG. 3, in a case where the source region 125 is formed by the usual ion-implantation and the thermal diffusion treatment at the high temperature, the source region 125 inevitably becomes shallower gradually from the vicinity of the lateral end of the protruding portion 150b toward the trench 110 (buried portion 150a). When the depth of the source region 125 near the buried portion 150a is decreased, a substantial channel length is made longer which results in the increase of the resistance. On the contrary, according to the first exemplary embodiment, the source region 25 can be formed at desired depth and concentration below the protruding portion 50b by the oblique ion implantation described above. Accordingly, the source region 25 can be formed substantially horizontally from the vicinity of the lateral end of the protruding portion 50b toward the trench 10 (buried portion 50a). As a result, increase of the on resistance is prevented.

Further, formation of the bridge portion 50c connecting the protruding portions 50b adjacent with each other preferably decreases the gate resistance further. In this case, the impurity can be introduced reliably into the channel layer 20 below the bridge portion 50c by the oblique ion implantation described above. Accordingly, the source region 25 is formed continuously along the trench 10. As a result, reduction of the channel width along the trench 10 is suppressed and the increase of the on resistance is prevented.

Further, the oblique ion implantation is effective also upon re-introduction of the P type impurity for controlling the threshold voltage. In usual ion implantation, the protruding portion 50b is obstructive. However, by the oblique ion implantation, the P type impurity can be introduced at a good accuracy also into the channel layer 20 below the protrusion portion 50b and the bridge portion 50c of the gate electrode 50. As a result, a desired threshold voltage can be obtained.

2. Second Exemplary Embodiment

Figure 12:
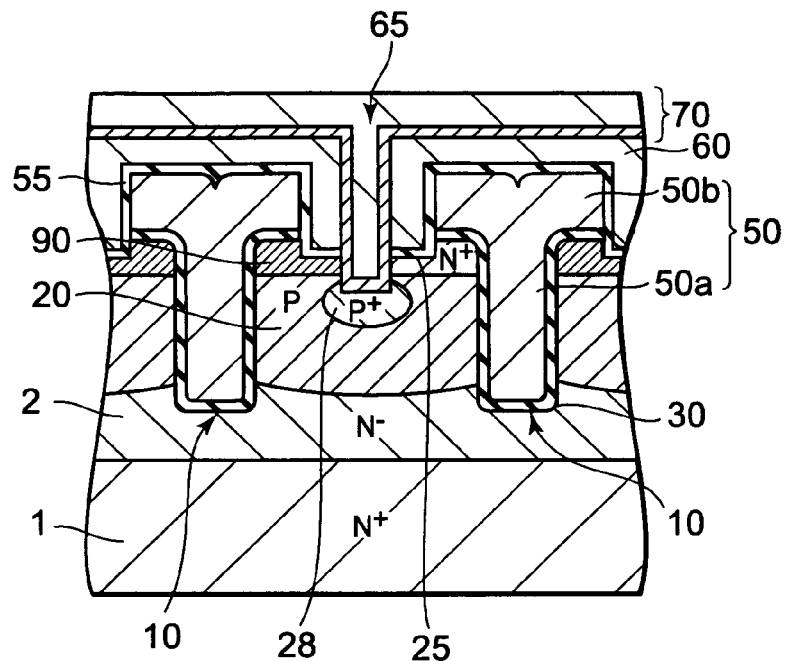
FIG. 12 is a cross sectional view showing a semiconductor device according to a second exemplary embodiment of the present invention.

FIG. 12 shows a cross structural structure along line A-A' of a vertical MOSFET according to a second exemplary embodiment. Components identical with those in the first exemplary embodiment carry same reference numerals, for which duplicate explanations are to be omitted optionally. As shown in FIG. 12, a concave portion 90 is formed to the surface of a source region 25 (semiconductor layer) between protruding portions 50b adjacent with each other in the second exemplary embodiment. The lateral side of the concave portion 90 defines a continuous surface with the lateral side of the protruding portion 50b. That is, the position for the lateral side of the concave portion 90 is substantially aligned with the position for the lateral side of the protruding portion 50b. As will be described next, the concave portion 90 is formed so as to conduct the oblique ion implantation more preferably.

Then, a method of manufacturing the structure shown in FIG. 12 is to be described. Steps to the formation of the gate electrode 50 (FIG. 11A to FIG. 11G) are identical with those in the first exemplary embodiment.

Figure 13A:
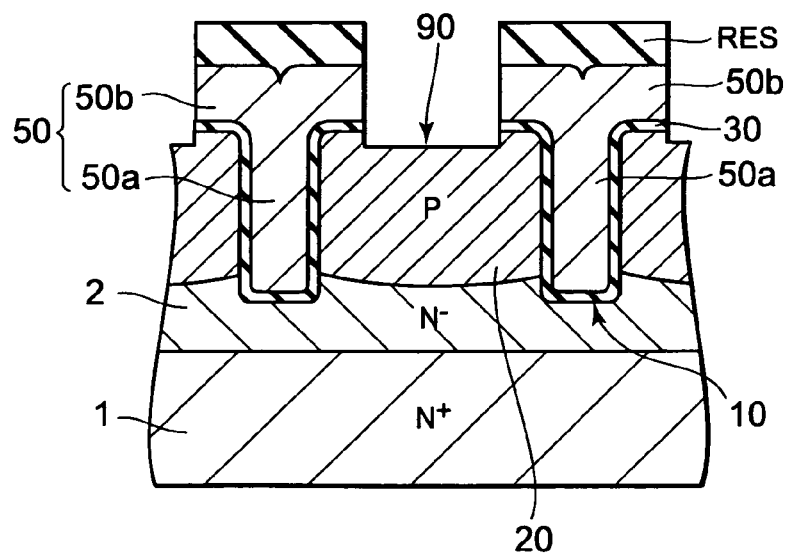
FIG. 13A is a cross sectional view showing a semiconductor device according to a second exemplary embodiment.

After the structure shown in FIG. 11G has been obtained, a concave portion 90 is formed to the surface of the channel layer 20 (semiconductor layer) between protruding portions 50b adjacent with each other as shown in FIG. 13A. Specifically, the channel layer 20 is etched by using the resist mask RES and the gate electrode 50 as a mask and the protrusion 90 is formed to the surface thereof. That is, the gate electrode 50 (protrusion portion 50b) and the concave portion 90 are formed in a self-alignment manner. As a result, the lateral side of the concave portion 90 and the lateral side of the protruding portion 50b define a continuous surface. That is, the position for the lateral surface of the concave portion 90 substantially aligned with a position for the lateral side of the protruding portion 50b. The depth of the concave portion 90 is about ½ for the depth of the N+ type source region 25 to be formed later.

Figure 13B:
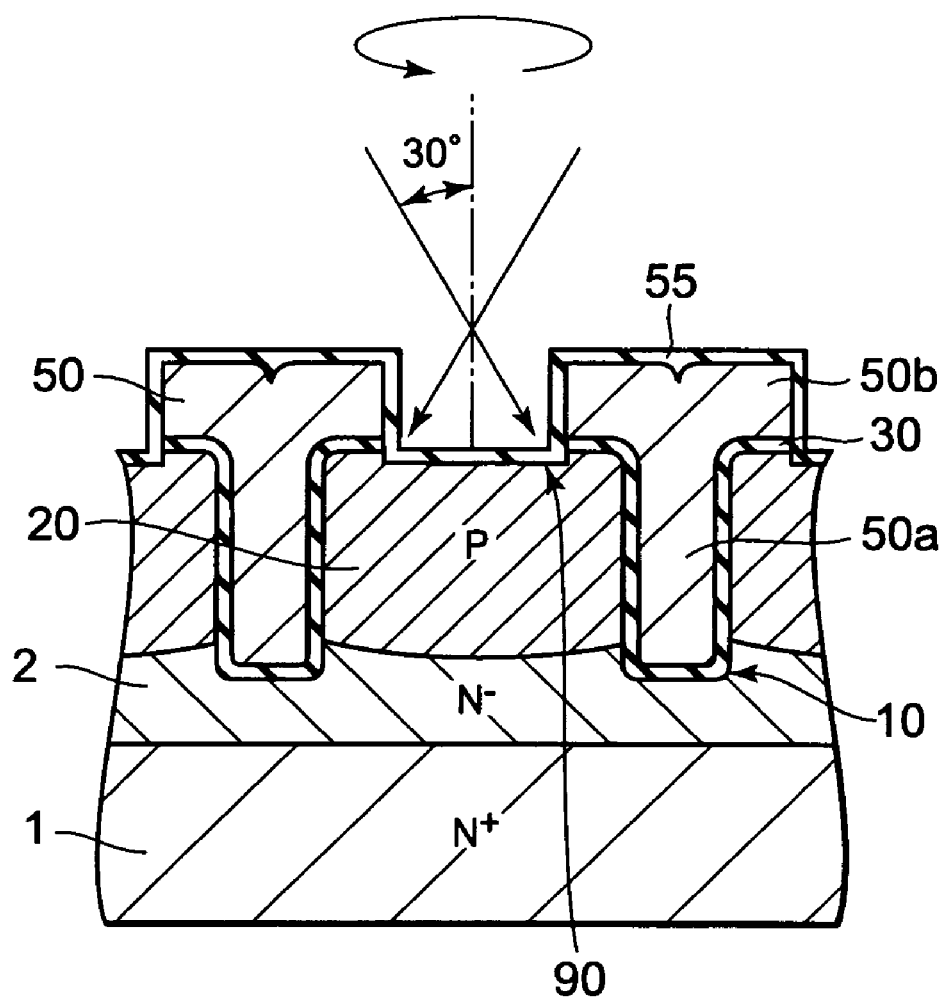
FIG. 13B is a cross sectional view showing a semiconductor device according to a second exemplary embodiment.

Then, after removing the resist mask RES, as shown in FIG. 13B, a protective insulating film 55 is formed over the entire surface for moderating damages upon ion implantation. Successively, for adjusting the threshold voltage (Vt) of the vertical MOSFET, oblique ion implantation is conducted. The oblique ion implantation method is identical with that in the first exemplary embodiment (refer to FIG. 11H).

Figure 13C:
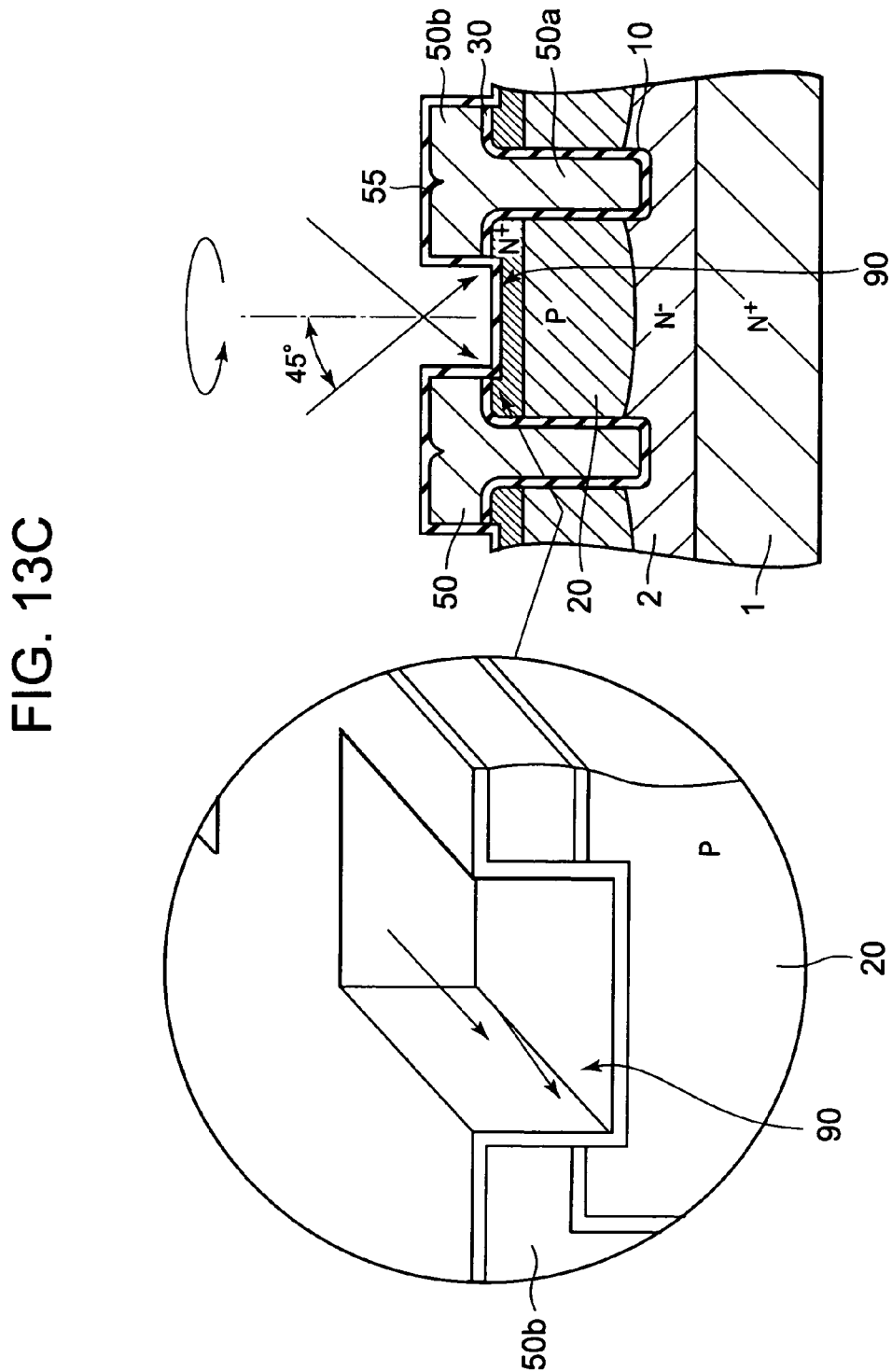
FIG. 13C is a cross sectional view showing a semiconductor device according to a second exemplary embodiment.

Then, as shown in FIG. 13C, oblique ion implantation is conducted for forming the N+ type source region 25 (impurity layer). The oblique ion implantation method is identical with that in the first exemplary embodiment (refer to FIG. 11I). The subsequent steps are also identical with those in the first exemplary embodiment (FIG. 11J to FIG. 11L).

As has been described above, in the second exemplary embodiment, the concave portion 90 is formed to the surface of the channel layer 20 between the protruding portions 50b adjacent with each other. That is, a side wall is formed to the channel layer 20 (aligned with the side wall of the concave portion 90) below the protruding portion 50b. Accordingly, oblique ion implantation of the impurity to a region below the protruding portion 50b can be conducted more easily. Even when the incident angle is increased, reflection of implanted ions, etc. can be suppressed and the impurity can be implanted smoothly. In a case where the depth of the concave portion 90 is about ½ for the depth of the source region, reflection of implanted ions can be suppressed without greatly decreasing the source region 25. This is preferred with a view point of the on resistance.

3. Third Exemplary Embodiment

Figure 14A:
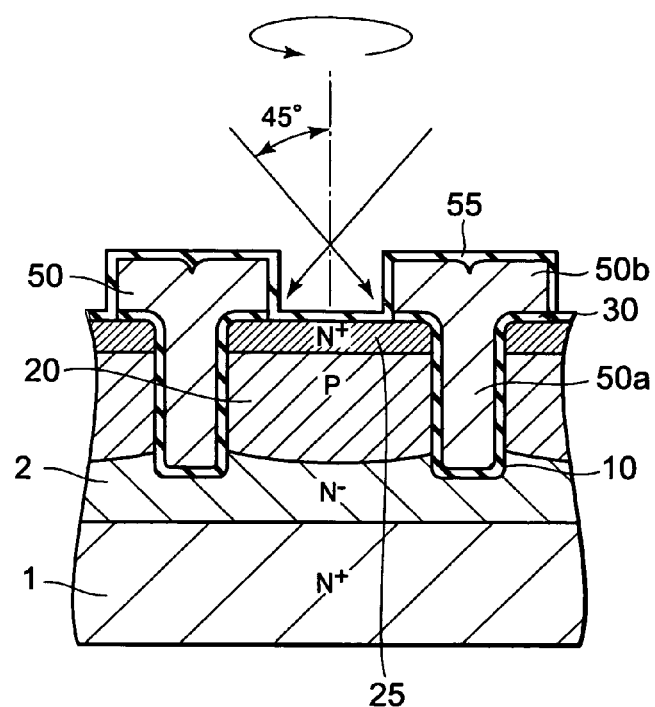
FIG. 14A is a cross sectional view showing a semiconductor device according to a third exemplary embodiment of the present invention.
Figure 14B:
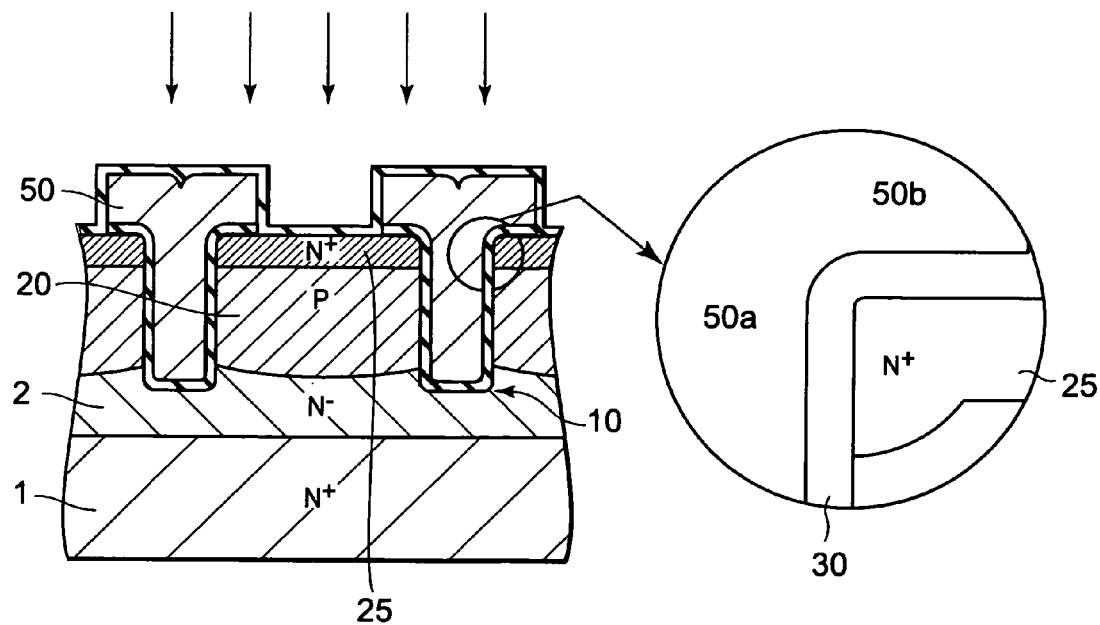
FIG. 14B is a cross sectional view showing a semiconductor device according to a third exemplary embodiment of the present invention.

In the first or the second exemplary embodiment described above, ion implantation upon forming the source region 25 may be divided into two steps. Specifically, as shown in FIG. 14A, "oblique ion implantation" is conducted at first. Oblique ion implantation is conducted at an incident angle of 45° by using, for example, a medium current ion implantation device capable of changing the incident angle. This introduces the N type impurity into the channel layer 20 below the protruding portion 50b and the bridge portion 50c of the gate electrode 50. Then, as shown in FIG. 14B, "ion implantation at incident angle 0°" is conducted. Ion implantation is conducted at an incident angle of 0° by using, for example, a high current ion implantation device. This introduces the N type impurity into the channel layer 20 between the buried portions 50a adjacent with each other. The order of applying "oblique ion implantation" and "ion implantation at incident angle 0°" may be replaced from each other.

In a case of performing the ion implantation by the method described above, the depth of the source region 25 can be controlled such that it is gradually increased from the vicinity at the lateral end of the protruding portion 50b toward the lateral wall of the trench 10 (refer to an enlarged view in FIG. 14B). As a result, the channel length can be shortened. Further, oblique ion implantation taking much time in the medium current ion implantation device can be compensated by the high speed implantation of the high current ion implantation device to preferably shorten the time.

The preferred exemplary embodiments of the present invention have been described with reference to the appended drawings. However, the present invention is not restricted to the exemplary embodiments described above but can be properly modified by a person skilled in the art within a scope not departing the gist thereof.

Further, it is noted that Applicant's intent is to encompass equivalents of all claim elements, even if amended later during prosecution.

What is claimed is:

1. A method of manufacturing a semiconductor device, comprising:
   forming a semiconductor layer having a plurality of stripe-like trenches;
   forming a gate electrode buried partially in each of the plurality of trenches; and
   introducing an impurity into the semiconductor layer by ion implantation after forming the gate electrode,
   wherein the gate electrode comprises:
      a buried portion formed in each of the trenches; and
      a protruding portion that is formed on the buried portion and has a width greater than a width of the buried portion,
   wherein the introducing the impurity includes introducing the impurity into the semiconductor layer below the protruding portion by oblique ion implantation, and
   wherein the protruding portion comprises a first protruding portion and a second protruding portion adjacent to the first protruding portion, and the introducing of the impurity comprises implanting the impurity under the first protruding portion at a first incident angle and implanting the impurity under the second protruding portion at the first incident angle.

2. The method according to claim 1, wherein the gate electrode further includes a bridge portion for connecting the first and second protruding portions, and
   wherein the introducing of the impurity comprises introducing the impurity into the semiconductor layer below the bridge portion by the oblique ion implantation.

3. The method according to claim 2, wherein the introducing of the impurity comprises rotating the device about an axis which is located between the first and second protruding portions in order to implant the impurity under the first protruding portion, the bridge portion and the second protruding portion, in that order, the first incident angle comprising an angle formed between the axis and an implant direction of the impurity.

4. The method according to claim 1, wherein the semiconductor device comprises a vertical field effect transistor, and wherein a source region of the vertical field effect transistor is formed by the introducing the impurity.

5. The method according to claim 4, further comprising:
   introducing an impurity of a conduction type opposite to that of the impurity forming the source region into the semiconductor layer below the protruding portion by oblique ion implantation.

6. The method according to claim 1, further comprising:
   forming a channel layer in the semiconductor layer adjacent to the plurality of trenches; and
   forming of a source region in the semiconductor layer and on the channel layer,
   wherein the introducing of the impurity is performed in the forming of the source region.

7. The method according to claim 6, further comprising:
   forming a protective insulating film on the gate electrode and the channel layer,
   wherein the introducing of the impurity comprises implanting the impurity into the semiconductor layer through the protective insulating film.

8. The method according to claim 7, wherein the protective insulating film moderates a damage to the semiconductor layer caused by the oblique ion implantation.

9. The method according to claim 1, further comprising:
after the forming of the gate electrode, and before the introducing of the impurity, adjusting a threshold voltage of the semiconductor device,
wherein a high temperature treatment is not performed on the semiconductor device after the adjusting of the threshold voltage.

10. The method according to claim 9, wherein the adjusting of the threshold voltage comprises implanting an other impurity into the semiconductor layer by an other oblique ion implantation, and
wherein the other impurity is implanted at a second incident angle in the other oblique ion implantation, the first incident angle being greater than the second incident angle.

11. The method according to claim 1, wherein the oblique ion implantation comprises implanting the impurity into the semiconductor layer under the first protruding portion and rotating the device to implant the impurity into the semiconductor layer under the second protruding portion.

12. The method according to claim 1, wherein the forming of the semiconductor layer comprises forming the semiconductor layer on a substrate, and
wherein the method further includes:
rotating the substrate during the introducing of the impurity into the semiconductor layer.

13. The method according to claim 1, further comprising:
after the introducing of the impurity, performing a thermal diffusion treatment at a low temperature.

14. The method according to claim 1, wherein the protruding portion of the gate electrode comprises an eave portion formed on an upper surface of the semiconductor layer, the eave portion having a width which is 0.1 μm or less.

15. The method according to claim 14, wherein the introducing of the impurity comprises forming of a source region in an surface of the semiconductor layer,
wherein the source region comprises a first portion which is formed under the eave portion of the protruding portion and contacts a sidewall of a trench of the plurality of trenches, and a second portion which is formed outside of the eave portion, and
wherein at the sidewall of the trench, a thickness of the first portion of the source region is substantially equal to a thickness of the second portion of the source region.

16. A method of forming a semiconductor device including a vertical MOSFET, comprising:
forming adjacently first and second trenches on a layer;
forming a gate electrode including a first buried portion in the first trench and a first protruding portion from the first buried portion, the gate electrode further including a second buried portion in the second trench and a second protruding portion from the second buried portion, the first and second protruding portions being formed on the layer so that a space between the first and second protruding portions is smaller than a distance between the first and second trenches; and
introducing an impurity into a layer by oblique ion implantation, the impurity being implanted under the first protruding portion at a first incident angle and implanted under the second protruding portion at the first incident angle.

* * * * *